United States Patent
He et al.

(10) Patent No.: US 10,741,739 B2
(45) Date of Patent: Aug. 11, 2020

(54) MICRO LED TRANSFERRING METHOD, MICRO LED DISPLAY PANEL AND MICRO LED DISPLAY DEVICE

(71) Applicant: SHANGHAI TIANMA MICRO-ELECTRONICS CO., LTD., Shanghai (CN)

(72) Inventors: Zeshang He, Shanghai (CN); Liang Xing, Shanghai (CN); Jujian Fu, Shanghai (CN); Gang Liu, Shanghai (CN)

( * ) Notice: Subject to any disclaimer, the term of this patent is extended or adjusted under 35 U.S.C. 154(b) by 17 days.

(21) Appl. No.: 16/244,102

(22) Filed: Jan. 10, 2019

(65) Prior Publication Data

US 2019/0148611 A1    May 16, 2019

(30) Foreign Application Priority Data

Aug. 24, 2018  (CN) .......................... 2018 1 0972545

(51) Int. Cl.
*H01L 25/16* (2006.01)
*H01L 33/62* (2010.01)
(Continued)

(52) U.S. Cl.
CPC .............. *H01L 33/62* (2013.01); *H01L 24/83* (2013.01); *H01L 24/95* (2013.01); *H01L 25/0753* (2013.01); *H01L 25/167* (2013.01); *H01L 33/36* (2013.01); *H01L 33/0095* (2013.01); *H01L 2224/8322* (2013.01); *H01L 2224/83234* (2013.01); *H01L 2224/83871* (2013.01);
(Continued)

(58) Field of Classification Search
CPC ... H01L 33/00; H01L 33/009; H01L 33/0095; H01L 33/36; H01L 33/62; H01L 25/07; H01L 25/075; H01L 25/0753; H01L 25/16; H01L 25/167; H01L 24/83; H01L 24/95

USPC .......................................................... 257/72
See application file for complete search history.

(56) References Cited

U.S. PATENT DOCUMENTS

2013/0126589 A1    5/2013  Bibl et al.
2018/0096977 A1    4/2018  Ahmed et al.
(Continued)

FOREIGN PATENT DOCUMENTS

CN    104094422 A    10/2014
CN    105206642 A    12/2015
(Continued)

*Primary Examiner* — Monica D Harrison
(74) *Attorney, Agent, or Firm* — Kilpatrick Townsend & Stockton, LLP (57) ABSTRACT

A Micro LED transferring method, a Micro LED display panel and a Micro LED display device are provided. The Micro LED display panel includes a substrate, a pixel defining layer including multiple openings, first conducting layer located in the multiple openings, photosensitive conductive bonding layers and Micro LED structures. The photosensitive conductive bonding layer is solidified after receiving light, such that elements adhered on two opposite surfaces of the photosensitive conductive bonding layer are bonded together. Due to the photosensitive conductive bonding layer, a Micro LED is detected during a transferring process rather than after a bonding process, thereby eliminating a step of removing a bonded abnormal Micro LED, thus simplifying the detecting and repairing processes of Micro LEDs.

18 Claims, 7 Drawing Sheets

(51) Int. Cl.
*H01L 25/075* (2006.01)
*H01L 33/36* (2010.01)
*H01L 23/00* (2006.01)
*H01L 33/00* (2010.01)

(52) U.S. Cl.
CPC .............. *H01L 2224/95001* (2013.01); *H01L 2924/12041* (2013.01); *H01L 2933/0066* (2013.01)

(56) References Cited

U.S. PATENT DOCUMENTS

2018/0342691 A1* 11/2018 Lu .................... H01L 33/005
2019/0035974 A1    1/2019 Li et al.
2019/0387616 A1* 12/2019 Hsieh ................ H05K 1/181

FOREIGN PATENT DOCUMENTS

| CN | 107359175 A | 11/2017 |
| --- | --- | --- |
| CN | 107731863 A | 2/2018 |
| CN | 107742636 A | 2/2018 |
| CN | 108172590 A | 6/2018 |

* cited by examiner

MICRO LED TRANSFERRING METHOD, MICRO LED DISPLAY PANEL AND MICRO LED DISPLAY DEVICE

The present application claims priority to Chinese Patent Application No. 201810972545.7, titled "MICRO LED TRANSFERRING METHOD, DISPLAY PANEL AND DISPLAY DEVICE", filed on Aug. 24, 2018 with the Chinese Patent Office, which is incorporated herein by reference in its entirety.

FIELD

The present disclosure relates to the field of a display technology, and in particular to a micro light emitting diode (Micro LED) transferring method, a Micro LED display panel and a Micro LED display device.

BACKGROUND

The Micro LED display is becoming more and more attractive in the future. The LED used in the Micro LED display has a micrometer-order size, and has advantages such as individually controlled pixels, individually controlled light-emission, high brightness, low power consumption, high resolution and high chrominance. However, there are also many complicated and difficult technical issues to be solved in the Micro LED display, especially the mass transfer technology which is critical in the Micro LED display. With the development of technologies, multiple technical branches are developed from the mass transferring technology, such as the electrostatic adsorption technology and the laser technology.

In a conventional micro LED mass transferring method, a micro element is transferred from a transferring substrate to a receiving substrate through wafer bonding. The transferring method includes a direct transferring method and an indirect transferring method. In the direct transferring method, a micro element array is directly bonded to the receiving substrate from the transferring substrate, then the transferring substrate is removed. In the indirect transferring method, the bonding/stripping step is performed twice, parts of a micro element array located on an intermediate substrate are picked up by the transferring head, and are bonded to the receiving substrate, then the transferring head is removed.

However, in the conventional mass transferring technology including the direct transferring method and the indirect transferring method, the Micro LED is detected via a detecting circuit after the bonding of the Micro LED to the receiving substrate, and the Micro LED is replaced or repaired in a case that the Micro LED emits light abnormally, which results in a complicated detecting and repairing processes.

SUMMARY

In view of the above, a Micro LED transferring method, a Micro LED display panel and a Micro LED display device are provided according to the present disclosure, to solve an issue of complicated detecting and repairing processes in the conventional technology caused by the fact that the replacing or repairing process on an abnormal Micro LED is performed in a case that the Micro LED is already bonded to a receiving substrate.

A Micro LED display panel is provided, which includes a substrate, a pixel defining layer, first conducting layers, photosensitive conductive bonding layers and Micro LED structures. The pixel defining layer is located on a surface of the substrate, and the pixel defining layer includes multiple openings. The first conducting layers are respectively located in the multiple openings. The photosensitive conductive bonding layer is located on a surface of the first conducting layer facing away from the substrate. The Micro LED structure is located on a surface of the photosensitive conductive bonding layer facing away from the first conducting layer, and at least one electrode of the Micro LED structure is electrically connected with the photosensitive conductive bonding layer.

A Micro LED display device including the Micro LED display panel described above is further provided according to the present disclosure.

A Micro LED transferring method for forming the Micro LED display panel described above is further provided according to the present disclosure. The Micro LED transferring method includes:

providing an array substrate, multiple Micro LED structures, photosensitive conductive bonding layers and a transferring head, where the array substrate includes a substrate, a pixel defining layer located on the substrate and first conducting layers, the pixel defining layer includes multiple openings, the first conducting layers are respectively located in the multiple openings;

picking up, by the transferring head, the multiple Micro LED structures;

bonding each of the picked Micro LED structures to one first conducting layer via the photosensitive conductive bonding layer;

conducting the Micro LED structure by applying an electrical signal to the first conducting layer;

removing the transferring head, where in a case that the Micro LED structure emits light normally, the Micro LED structure is bonded to the array substrate through the photosensitive conductive layer; and in a case that the Micro LED structure emits light abnormally, the Micro LED structure is removed away by the transferring head.

The Micro LED display panel according to the present disclosure includes a substrate, a pixel defining layer including multiple openings, first conducting layers located in the openings, photosensitive conductive bonding layers and Micro LED structures. The photosensitive conductive bonding layer is solidified after receiving light, such that elements adhered on two opposite surfaces of the photosensitive conductive bonding layer can be bonded together. That is, during a manufacturing process of the Micro LED display panel in the present disclosure, after the Micro LED is transferred onto the photosensitive conductive bonding layer on the substrate, electrical signals are applied to two electrodes of the Micro LED to conduct the Micro LED. In a case that the Micro LED emits light normally, a corresponding photosensitive conductive bonding layer is solidified after receiving the light, such that the Micro LED is bonded onto the first conducting layer. In a case that the Micro LED emits light abnormally, the corresponding photosensitive conductive bonding layer receives no suitable light, such that the first conducting layer and the abnormal Micro LED are not bonded together. In this way, during the transferring process, it is detected whether a Micro LED emits light normally, and a normal Micro LED is bonded, while an abnormal Micro LED is not bonded and is replaced with a normal Micro LED. Therefore, all Micro LEDs on the formed Micro LED display panel can emit light normally.

In the Micro LED display panel in the present disclosure, the photosensitive conductive bonding layer is arranged, such that the Micro LED is detected during the transferring process rather than after the bonding process, thereby eliminating a step of removing a bonded abnormal Micro LED, thus simplifying the detecting and repairing processes on Micro LEDs.

A Micro LED display device is further provided in the present disclosure, which includes the Micro LED display panel described above.

A Micro LED transferring method is further provided in the present disclosure. In the method, a Micro LED is detected and bonded during one step. That is, the Micro LED is detected during the transferring process rather than after the bonding process. Therefore, a step of removing a bonded abnormal Micro LED is eliminated, thereby simplifying the detecting and repairing processes on a Micro LED.

It is to be noted that, all Micro LEDs on the Micro LED display panel formed through the Micro LED transferring method in the present disclosure emit light normally, such that it is unnecessary to perform a backup, thereby reducing a cost for manufacturing the Micro LEDs. In addition, since only a sub-pixel is provided with only one LED element on the Micro LED display panel, thereby ensuring display uniformity and improving pixels per inch (PPI) of the Micro LED display panel.

BRIEF DESCRIPTION OF THE DRAWINGS

The drawings to be used in the description of the embodiments are described briefly as follows according to the embodiments of the present disclosure become clearer. It is apparent that the drawings in the following description only illustrate some embodiments of the present disclosure.

DETAILED DESCRIPTION OF EMBODIMENTS

As described in the background part, in the conventional mass transferring technology including the direct transferring method and the indirect transferring method, the Micro LED is detected via a detecting circuit after the Micro LED is bonded to the receiving substrate. The Micro LED is replaced or repaired in a case that the Micro LED emits light abnormally, which results in a complicated detecting and repairing processes.

In the conventional technology, during a Micro LED direct transferring process or a Micro LED indirect transferring process, the Micro LED is not detected. Instead, the Micro LED is detected through a certain detecting method after all Micro LEDs are transferred. In a case that there is a Micro LED emitting light abnormally, the Micro LED is repaired, for example, the Micro LED is replaced with a redundant transferred Micro LED, or the bonded Micro LED is directly replaced by a new one. The process of replacing the abnormal bonded Micro LED includes: de-bonding the abnormal Micro LED, removing the abnormal Micro LED, placing a new Micro LED, bonding the new Micro LED, and detecting the bonded new Micro LED. If the bonded new Micro LED emits light normally, the detecting and repairing processes are completed, and if the new bonded Micro LED still emits light abnormally, the above process is performed again until all sub-pixels on the Micro LED display panel can display normally. As can be seen, in the conventional technology, the Micro LED is detected via a detecting circuit after the Micro LED is bonded, then the repairing process is performed if there is an abnormal Micro LED, thereby possibly requiring dedicated detecting devices and resulting in complicated detecting and repairing processes.

In view of the above, a Micro LED display panel is provided according to the present disclosure, which includes a substrate, a pixel defining layer, first conducting layers, photosensitive conductive bonding layers and Micro LED structures. The pixel defining layer is located on a surface of the substrate, and the pixel defining layer includes multiple openings. The first conducting layers are respectively located in the multiple openings. The photosensitive conductive bonding layer is located on a surface of the first conducting layer facing away from the substrate. The Micro LED structure is located on a surface of the photosensitive conductive bonding layer facing away from the first conducting layer, and at least one electrode of the Micro LED structure is electrically connected with the photosensitive conductive bonding layer.

The Micro LED display panel according to the present disclosure includes the photosensitive conductive bonding layer. The photosensitive conductive bonding layer is solidified after receiving light emitted from a normal Micro LED, such that the Micro LED is bonded to the substrate to form the Micro LED display panel. That is, the Micro LED is detected during the transferring process of the Micro LED, thereby avoiding a complicated process of removing and replacing the Micro LEDs, thus simplifying detecting and repairing processes.

The embodiments of the present disclosure are described in conjunction with the accompanying drawings in the embodiments of the present disclosure hereinafter. It is apparent that the described embodiments are merely some rather than all of embodiments of the present disclosure.

Figure 1:
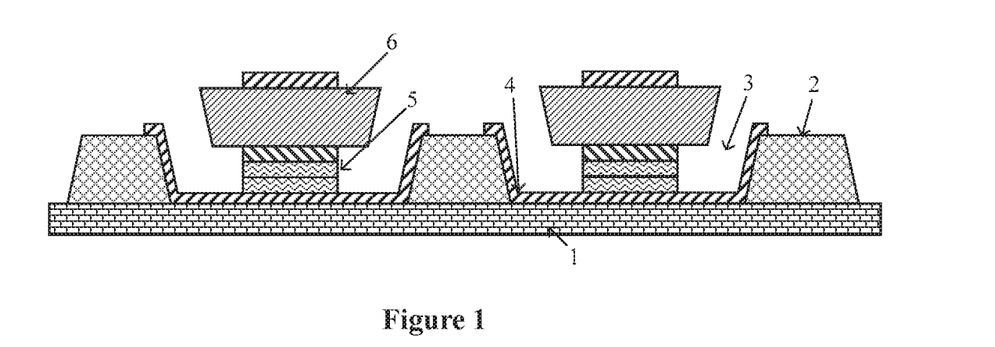
FIG. 1 is a schematic structural diagram of a Micro LED display panel according to an embodiment of the present disclosure.

Referring to FIG. 1, FIG. 1 is a schematic structural diagram of a Micro LED display panel according to an embodiment of the present disclosure. The Micro LED display panel includes a substrate 1, a pixel defining layer 2, first conducting layers 4, photosensitive conductive bonding layers 5 and Micro LED structures 6. The pixel defining layer 2 is located on a surface of the substrate 1, and the pixel defining layer 2 includes multiple openings 3. The first conducting layer 4 is located in the opening 3. The photosensitive conductive bonding layer 5 is located on a surface of the first conducting layer 4 facing away from the substrate 1. The Micro LED structure 6 is located on a surface of the photosensitive conductive bonding layer 5 facing away from the first conducting layer 4, and at least one electrode of the Micro LED structure 6 is electrically connected with the photosensitive conductive bonding layer 5.

It is to be noted that, a material of the photosensitive conductive bonding layer is not limited in this embodiment. The photosensitive conductive bonding layer may be made of any material that can be solidified after receiving light emitted by a Micro LED structure 6 to be bonded, to bond the Micro LED structure 6 to the first conducting layer 4 on the substrate 1. In an embodiment of the present disclosure, the photosensitive conductive bonding layer 5 may include a photosensitive layer, and the photosensitive layer is doped with metallic balls or nano-silver material. The material of the photosensitive layer may include acrylic ester copolymers, active monomers and photo-initiator, and the photo-initiator is visible light photo-initiator.

It is to be noted that, in this embodiment, the openings 3 of the pixel defining layer may respectively correspond to different photo-initiator. A dominant absorption wavelength of the photo-initiator is the same as a wavelength of a light emitted from the Micro LED structure 6 connected with the photosensitive conductive bonding layer 5. It is to be noted that, the wavelength of the light emitted by the LED usually has a wave peak, and there is a range having a certain wavelength width around the wave peak. In this embodiment, the dominant absorption wavelength of the photo-initiator is the same as the wavelength of the light emitted by the LED, where the dominant absorption wavelength means a range with a certain wavelength width, rather than an actual wavelength. For example, the Micro LED display panel includes multiple sub-pixels which include red sub-pixels, green sub-pixels and blue sub-pixels. If the Micro LED structure 6 in the opening 3 of the pixel defining layer emits a red light, the dominant absorption wavelength of the photo-initiator of the photosensitive conductive bonding layer 5 in the opening 3 is set to be a wavelength of the red light such as a wavelength range from 560 nm to 610 nm. In an embodiment of the present disclosure, if a wave peak of the red light is at a wavelength of 610 nm, the dominant absorption wavelength of the photo-initiator is within a wavelength range near 610 nm rather than being limited to 610 nm. Similarly, if the Micro LED structure 6 in the opening 3 of the pixel defining layer emits a green light, the dominant absorption wavelength of the photo-initiator of the photosensitive conductive bonding layer 5 in the corresponding opening 3 is set to be a wavelength of the green light. If the Micro LED structure 6 in the opening 3 of the pixel defining layer emits a blue light, the dominant absorption wavelength of the photo-initiator of the photosensitive conductive bonding layer 5 in the corresponding opening 3 is set to be a wavelength of the blue light. It is to be noted that, the dominant absorption wavelength of the photo-initiator is the same as the wavelength of the light emitted by a Micro LED structure, but the present disclosure is not limited thereto. In other embodiments of the present disclosure, the dominant absorption wavelength of the photo-initiator may be set to be another wavelength near the wavelength of the light emitted by the Micro LED structure.

Figure 2:
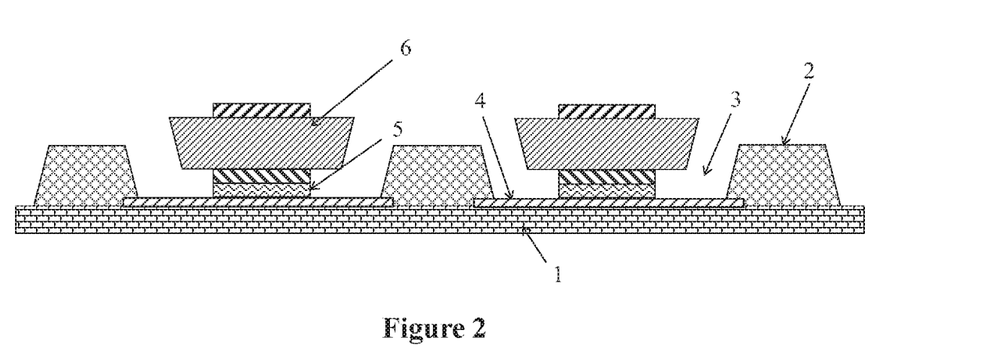
FIG. 2 is a schematic structural diagram of a Micro display panel according to another embodiment of the present disclosure.

In the embodiment of the present disclosure, the photosensitive conductive bonding layer may have a single layered structure or double-layered structure, which is not limited in this embodiment. As shown in FIG. 2, FIG. 2 is a schematic structural diagram of a Micro LED display panel according to another embodiment of the present disclosure. It is to be noted that, a position of the first conducting layer is not limited in this embodiment. The first conducting layer 4 may be formed after forming the pixel defining layer 2. As shown in FIG. 1, the first conducting layer 4 is formed on a bottom and side walls of the pixel defining layer 2. If the first conducting layer 4 is made of a high reflective metal, the first conducting layer 4 may reflect lateral light and downward light emitted by the Micro LED, thereby improving usage of light emitted by the Micro LED. The first conducting layer may also be formed before forming the pixel defining layer. As shown in FIG. 2, the first conducting layer 4 is located under the pixel defining layer 2. The first conducting layer may be formed on a flat surface, to facilitate the forming process.

The Micro LED display panel according to the present disclosure includes a substrate, a pixel defining layer, first conducting layers, photosensitive conductive bonding layers and Micro LED structures. The pixel defining layer includes multiple openings. The first conducting layer is located in the opening. The photosensitive conductive bonding layer is solidified after receiving light, such that elements adhered on two opposite surfaces of the photosensitive conductive bonding layer may be bonded together. That is, during a process of manufacturing the Micro LED display panel according to the present disclosure, after the Micro LED is bonded to the photosensitive conductive bonding layer on the substrate, electrical signals are applied to two electrodes of the Micro LED, to conduct the Micro LED. In a case that the Micro LED emits light normally, the corresponding photosensitive conductive bonding layer is solidified after receiving the light, to bond the light-emitting Micro LED to the first conducting layer. In a case that the Micro LED emits light abnormally, the corresponding photosensitive conductive bonding layer can not bond the Micro LED to the first conducting layer because no suitable light is received. Therefore, during a transferring process, it is detected whether a Micro LED emits light normally, and a normal Micro LED is bonded, while an abnormal Micro LED is not bonded and is replaced with a normal Micro LED. Therefore, all Micro LEDs on the Micro LEI) display panel can emit light normally.

Figure 3:
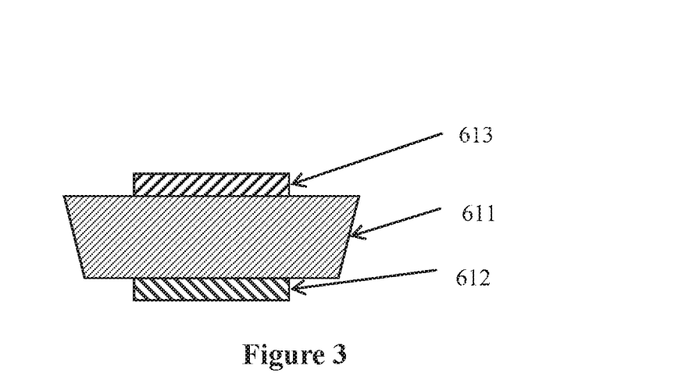
FIG. 3 is a schematic structural diagram of a Micro LED having a vertical structure according to an embodiment of the present disclosure.

A structure of the Micro LED structure 6 is not limited in this embodiment. In an embodiment of the present disclosure, the Micro LED structure 6 has a vertical structure. As shown in FIG. 3, FIG. 3 is a schematic structural diagram of a Micro LED having a vertical structure according to an embodiment of the present disclosure. The Micro LED having a vertical structure includes a LED semiconductor structure 611, as well as a first electrode 612 and a second electrode 613 respectively located on two opposite sides of the LED semiconductor structure 611. The LED semiconductor structure 611 includes a first semiconductor layer, an active layer and a second semiconductor layer sequentially stacked. A material and a structure of the Micro LED structure is not limited in this embodiment, thus materials of the first semiconductor layer, the active layer and the second semiconductor layer are not limited herein, which may be, for example, gallium nitride, gallium arsenide or the like. The material may be determined based on light emitted by the Micro LED structure, which is not described in detail in the embodiment.

In the embodiment, the first electrode 612 of the LED having a vertical structure is located on a side of the first semiconductor layer facing away from the active layer. The second electrode 613 of the LED having a vertical structure is located on a side of the second semiconductor layer facing away from the active layer. In a case that the LED semiconductor structure includes other layers, the first electrode is located on the outmost side of the LED semiconductor structure and is electrically connected with the first semiconductor layer, the second electrode is located on the outmost side of the LED semiconductor layer and is electrically connected with the second semiconductor layer, which is not limited in this embodiment.

Figure 4:
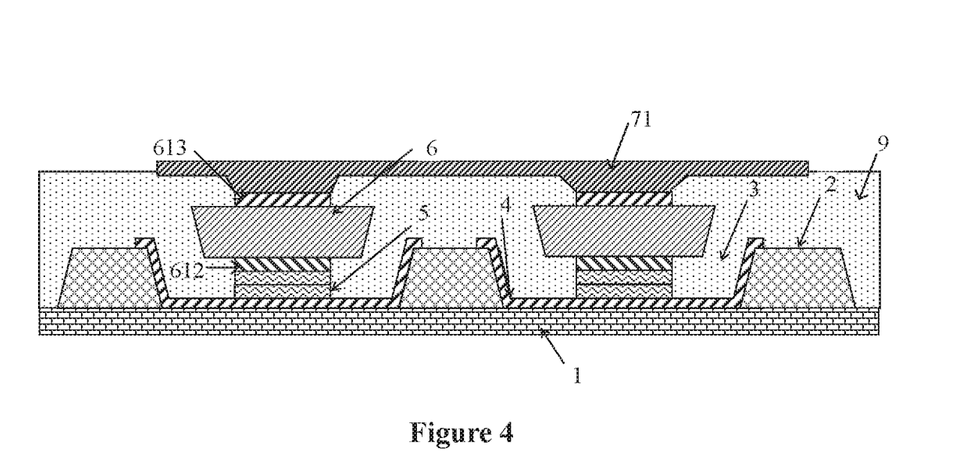
FIG. 4 is a schematic structural diagram of a Micro LED display panel according to another embodiment of the present disclosure.

In this embodiment, since the Micro LED structure has a vertical structure, and the first electrode and the second electrode are respectively located on two opposite sides of the LED semiconductor structure, during a bonding process of the LED semiconductor to the substrate, the first electrode may be electrically connected with the first conducting layer through the photosensitive conductive bonding layer. The second electrode is connected with an external circuit. By supplying power to the first conducting layer and the external circuit connected with the second electrode, the Micro LED structure is conducted. As shown in FIG. 4, FIG. 4 is a schematic structural diagram of a Micro LED display panel according to another embodiment of the present disclosure. The Micro LED display panel further includes a second conducting layer 71 and an insulating layer 9. The insulating layer 9 covers the Micro LED structure 6. The second conducting layer 7 is electrically connected with the second electrode 613 of the Micro LED structure through a via hole in the insulating layer 9. The Micro LED structure is controlled to emit light in response to an electrical signal applied to the first conducting layer 4 and the second conducting layer 71. A type of the first electrode 612 is not limited in this embodiment, the first electrode 612 may be an N-electrode, i.e., a negative electrode, or a P-electrode, i.e., a positive electrode.

It is to be noted that, a structure of the Micro LED display panel is not limited in this embodiment, and the Micro LED display panel may be a passive matrix light emitting diode display panel without an address selecting function. For example, second conducting layers 71 corresponding to multiple Micro LED structures in a same row are electrically connected to each other. First conducting layers corresponding to multiple Micro LED structures in a same column are electrically connected to each other. By applying an electrical signal to a cathode and an anode of each Micro LED, display of the Micro LED structures in a whole row or a whole column is controlled.

Figure 5:
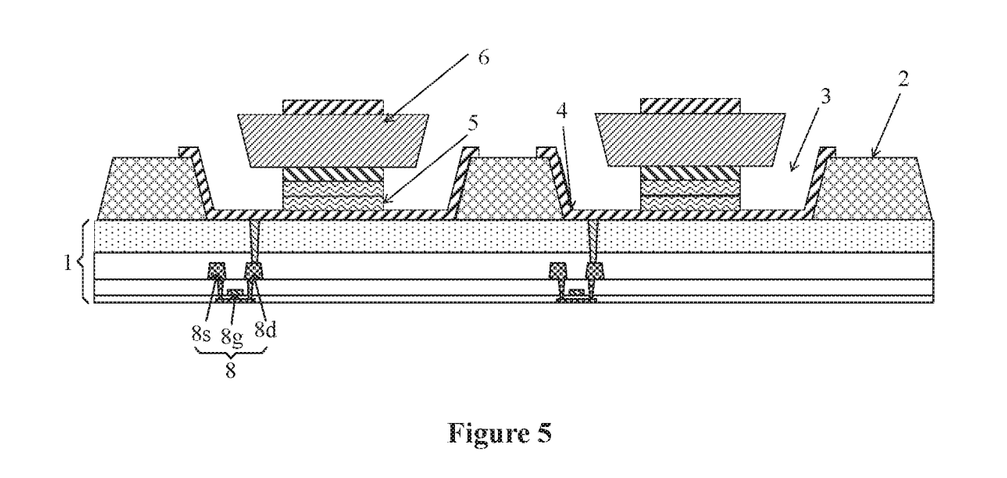
FIG. 5 is a schematic structural diagram of an active matrix Micro LED display panel according to an embodiment of the present disclosure.

In another embodiment of the present disclosure, the Micro LED display panel may be an active matrix light emitting diode display panel. As shown in FIG. 5, FIG. 5 is a schematic structural diagram of an active matrix Micro LED display panel according to an embodiment of the present disclosure. The substrate 1 further includes multiple thin film transistors, and at least two of the multiple thin film transistors control one Micro LED structure. It is to be noted that, one of the at least two thin film transistors is configured as a driving transistor, and at least one of the at least two thin film transistors other than the thin film transistor configured as a driving transistor is configured to supply a control voltage to the driving transistor. As shown in FIG. 5, a driving transistor 8 includes a gate 8g, a source 8s and a drain 8d. The drain 8d is electrically connected with the first conducting layer 4. Second electrodes of Micro LED structures in multiple openings 3 are electrically connected to each other through second conducting layers 72. In some embodiments, the drain may be replaced with a source, which is not limited in the embodiment.

The second electrodes of the Micro LED structures 6 in different openings are connected to each other through the second conducting layers, to form a common electrode, such that the second electrodes of the Micro LED structures are applied with the same electrical signal. By forming the thin film transistor 8 on the substrate 1, to control whether to apply an electrical signal to the first electrode of the Micro LED structure in each opening of the pixel defining layer, the display of the Micro LED structure in each opening of the pixel defining layer is controlled.

It is to be noted that, in a case that the Micro LED display panel is an active matrix light emitting diode display panel, the Micro LED display panel further includes a drive circuit (not shown in the figure). In some embodiments, the drive circuit is configured to apply an electrical signal to the gate of the thin film transistor, to turn on/off the thin film transistor, to control a sub-pixel to be lightened or in a dark state. The structure of the drive circuit is not limited in this embodiment, and any drive circuit that can achieve the above functions will fall into the protection scope of this embodiment of the present disclosure.

Figure 6:
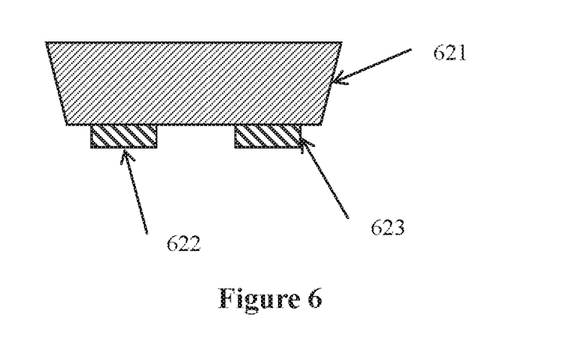
FIG. 6 is a schematic structural diagram of a Micro LED structure having an ipsilateral-electrode structure according to an embodiment of the present disclosure.
Figure 7:
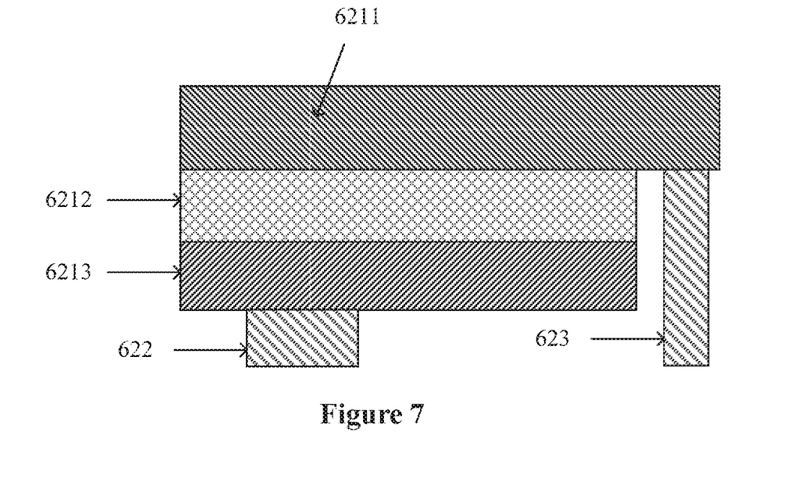
FIG. 7 is a schematic diagram showing a structure of a Micro LED structure having an ipsilateral-electrode structure according to an embodiment of the present disclosure.

In another embodiment of the present disclosure, the Micro LED structure may have an ipsilateral-electrode structure. The Micro LED structure includes a first semiconductor layer, an active layer and a second semiconductor layer sequentially stacked, and the Micro LED structure further includes a first electrode and a second electrode. Unlike the LED having a vertical structure, in the LED having an ipsilateral-electrode structure, the first electrode and the second electrode are located on the same side of the LED semiconductor structure. As shown in FIG. 6, FIG. 6 is a schematic structural diagram of a Micro LED structure having an ipsilateral-electrode structure according to an embodiment of the present disclosure. The Micro LED structure includes a LED semiconductor structure 621, as well as a first electrode 622 and a second electrode 623 located on the same side of the LED semiconductor structure 621. It is to be noted that, during a process of manufacturing the first electrode 622 and the second electrode 623, as shown in FIG. 7, the first electrode 622 is located on a surface of a first semiconductor layer 6213 facing away from an active layer 6212. Then, the first semiconductor layer 6213 and the active layer 6212 are etched to expose a part of the second semiconductor layer 6211. The second electrode 623 is formed on a surface of the second semiconductor layer 6211 facing toward the active layer 6212, and finally the LED structure having an ipsilateral-electrode structure is produced.

Figure 8:
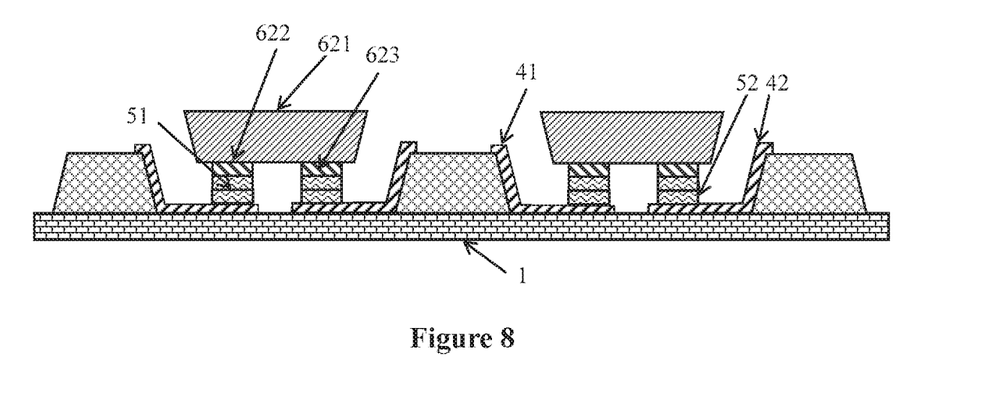
FIG. 8 is a schematic structural diagram of a Micro LED display panel according to another embodiment of the present disclosure.

Since the first electrode and the second electrode of the LED structure having an ipsilateral-electrode structure are located on the same side of the LED structure, the second electrode may be bonded to the first conducting layer through the photosensitive conductive bonding layer while bonding the first electrode to a first conducting layer through a photosensitive conductive bonding layer. It is to be noted that, it may be required to apply different voltage signals to the first electrode and the second electrode to conduct the Micro LED. As shown in FIG. 8, FIG. 8 is a schematic structural diagram of a Micro LED display panel according to another embodiment of the present disclosure. In this embodiment, the first conducting layer includes a first sub conducting layer 41 and a second sub conducting layer 42 insulated from each other. The photosensitive conductive bonding layer includes a first photosensitive conductive bonding layer 51 and a second photosensitive conductive bonding layer 52. The first photosensitive conductive bonding layer 51 is located on a surface of the first sub conducting layer 41 facing away from the substrate 1. The second photosensitive conductive bonding layer 52 is located on a surface of the second sub conducting layer 42 facing away from the substrate 1. The first electrode 622 is electrically connected with the first sub conducting layer 41 through the first photosensitive conductive bonding layer 51. The second electrode 623 is electrically connected with the second sub conducting layer 42 through the second photosensitive conductive bonding layer 52. By applying electrical signals to the first sub conducting layer 41 and the second sub conducting layer 42, display of the Micro LED structure is controlled.

Similar to the LED having a vertical structure, an external circuit connected with the first sub conducting layer and the second sub conducting layer is not limited in this embodiment, and a way to applying the electrical signal is not limited either. In an embodiment of the present disclosure, by applying a voltage to the first sub conducting layer and the second sub conducting layer connected with an individual Micro LED structure, the display of multiple Micro LED structures in a single row or a single column is controlled. That is, the Micro LED display panel is a passive matrix light emitting diode display panel.

Figure 9:
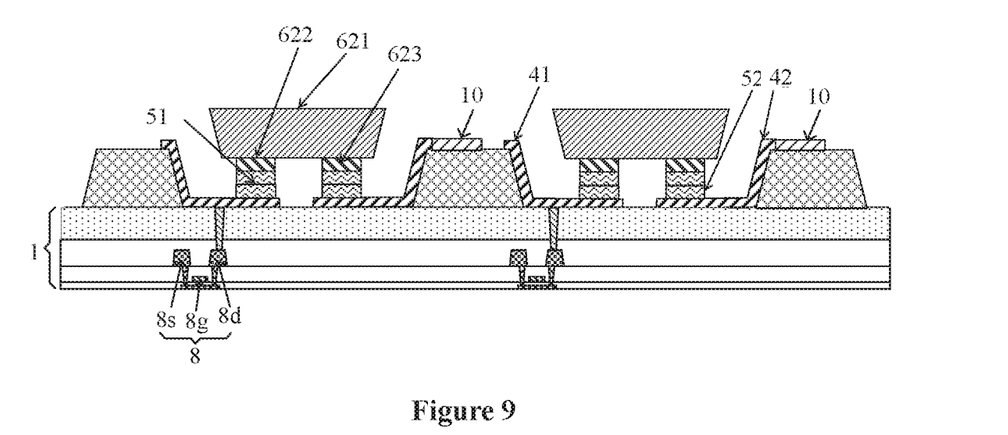
FIG. 9 is a schematic structural diagram of an active matrix Micro LED display panel according to another embodiment of the present disclosure.

In other embodiments of the present disclosure, as shown in FIG. 9. FIG. 9 is a schematic structural diagram of an active matrix Micro LED display panel according to an embodiment of the present disclosure. Multiple thin film transistors are formed on the substrate 1, that is, the substrate 1 further includes multiple thin film transistors. At least two of the multiple thin film transistors control one Micro LED structure. One of the at least two thin film transistors is configured as a driving transistor, and at least one of the at least two thin film transistors other than the driving transistor is configured to supply a control voltage for the driving transistor. As shown in FIG. 9, a driving transistor 8 includes a gate 8g, a source 8s and a drain 8d. The drain 8d is electrically connected with the first sub conducting layer 41. Second electrodes 623 of Micro LED structures in multiple openings are electrically connected to each other through a common connection line 10 between second sub conducting layers 42.

That is, the second electrodes 623 of the Micro LED structures in different openings are connected to each other through the second sub conducting layers, to form a common electrode, such that the second electrodes 623 of the Micro LED structures are applied with the same electrical signal. By forming a thin film transistor 8 on the substrate 1, it is controlled whether to apply an electrical signal to the first electrode 622 of the Micro LED structure in each opening of the pixel defining layer, such that display of the Micro LED structure in each opening of the pixel defining layer is controlled.

A forming method of the common connection line 10 is not limited in this embodiment. The common connection line 10 may be formed while forming the second sub conducting layer 42, and may also be formed independently. To reduce manufacturing steps and save cost, as shown in FIG. 9, the common connection line 10 and the second sub conducting layer 42 are made of the same material, and are formed in the same step.

It is to be noted that, in a case that the Micro LED display panel is an active matrix light emitting diode display panel, the Micro LED display panel further includes a drive circuit (not shown in the figure) for the thin film transistors. In some embodiments, the drive circuit is configured to apply an electrical signal to the gate of the thin film transistor, to turn on/off the thin film transistor, to control a sub-pixel to be lightened or in a dark state. The structure of the drive circuit is not limited in this embodiment, and any drive circuit that can achieve the above functions will fall into the protection scope of the embodiment of the present disclosure.

Figure 10:
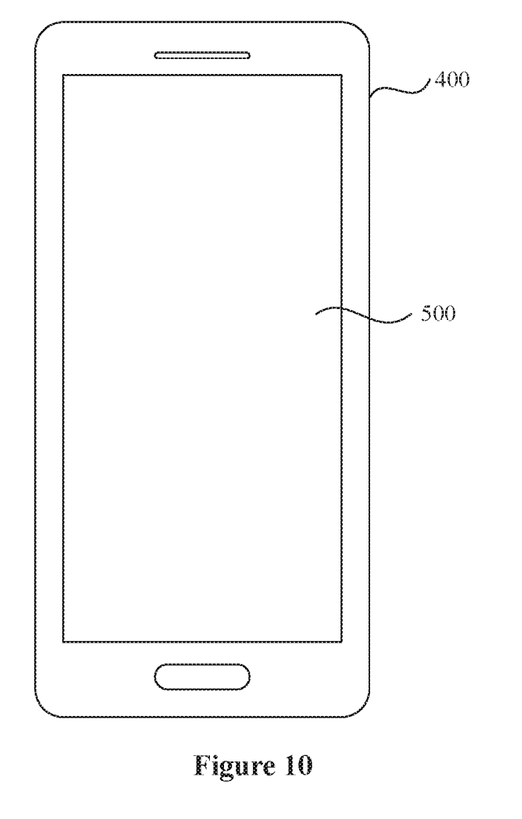
FIG. 10 is a schematic diagram of a display device according to an embodiment of the present disclosure.

A Micro LED device is provided in the present disclosure, which includes the Micro LED display panel according to any one of the embodiments described above. FIG. 10 is a schematic diagram of a display device according to an embodiment of the present disclosure. A display device 400 includes a display panel 500, and the display panel 500 is as described in any one of the embodiments of the present disclosure. The display device 400 may be a phone as shown in FIG. 10, and may also be a computer, a television, a wearable intelligent display device or the like, which is not limited in this embodiment.

Figure 11:
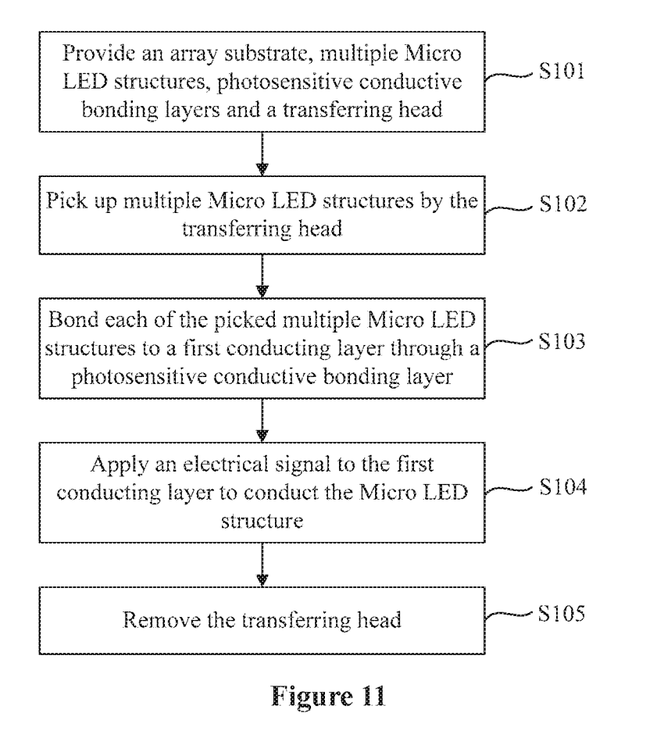
FIG. 11 is a flow chart of a Micro LED transferring method according to an embodiment of the present disclosure.

A Micro LED transferring method is further provided in the embodiment of the present disclosure, which is used to form the Micro LED display panel described in the above embodiments. As shown in FIG. 11, FIG. 11 is a flow chart of a Micro LED transferring method according to an embodiment of the present disclosure. The Micro LED transferring method includes the following steps S101 to S105.

In step S101, an array substrate, multiple Micro LED structures, photosensitive conductive bonding layers and a transferring head are provided. The array substrate includes a substrate, a pixel defining layer located on the substrate and first conducting layers. The pixel defining layer includes multiple openings, the first conducting layer is located in the opening.

Figure 12:
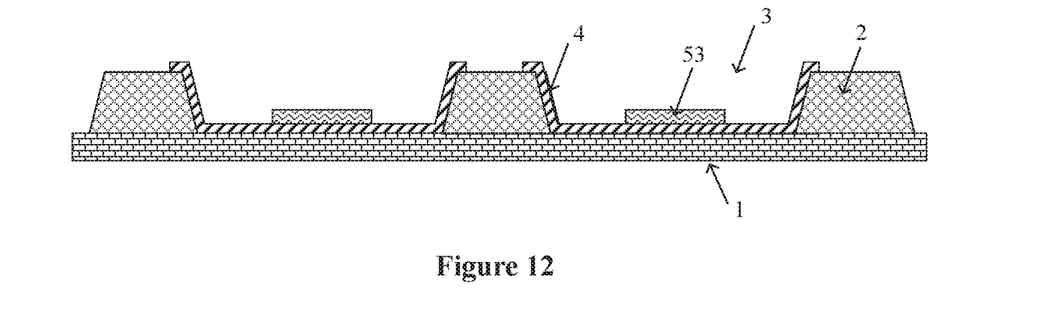
FIG. 12 is a schematic structural diagram of an array substrate according to an embodiment of the present disclosure.

As shown in FIG. 12, FIG. 12 is a schematic structural diagram of an array substrate according to an embodiment of the present disclosure. An array substrate includes a substrate 1, a pixel defining layer 2 located on the substrate 1 and first conducting layers 4. The pixel defining layer 2 includes multiple openings 3, and the first conducting layer 4 is formed in the opening 3. A method of arranging the photosensitive conductive bonding layer is not limited in this embodiment, as shown in FIG. 12, the photosensitive conductive bonding layer 5 may be formed in the opening through a printing process.

It is to be noted that, a structure of the Micro LED is not limited in this embodiment. The Micro LED may have a vertical structure, and may also have an ipsilateral-electrode structure. A LED having a vertical structure is taken as an example in the figures of the embodiment, but the present disclosure is not limited thereto.

In step S102, the multiple Micro LED structures are picked up by the transferring head.

Figure 13:
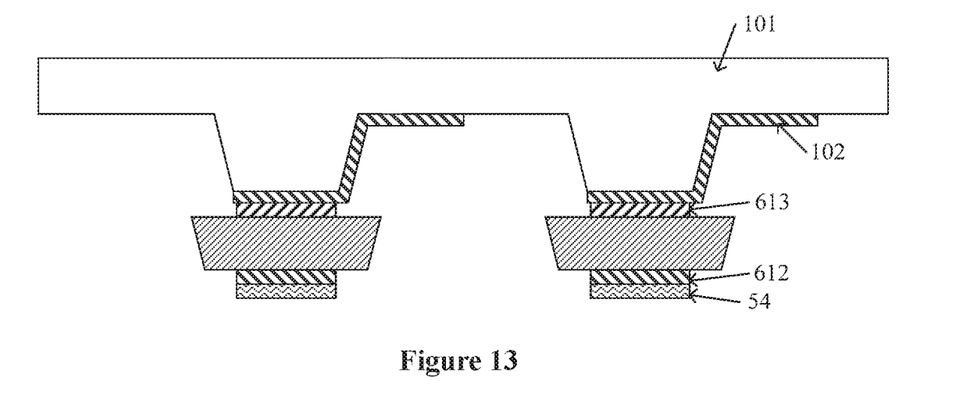
FIG. 13 is a schematic diagram showing a process of picking up multiple Micro LED structures by a transferring head.

As shown in FIG. 13, FIG. 13 is a schematic diagram showing a process of picking up multiple Micro LED structures by a transferring head according to an embodiment of the present disclosure.

It is to be noted that, in a case that the Micro LED structure has a vertical structure, the Micro LED includes a first electrode and a second electrode located oppositely to each other. A first conducting layer and a photosensitive conductive bonding layer in each opening of the pixel defining layer are provided as entire layers. The photosensitive conductive bonding layer is configured to connect with the first electrode. Since it may be required to conduct the first electrode and the second electrode of the LED during a bonding process, an auxiliary electrode, that is, a second conducting layer is added on the transferring head in this embodiment, to electrically connect with the second electrode of the LED having a vertical structure and to supply power to the second electrode.

In the embodiment, the providing a transferring head includes: providing a transferring head body 101; and forming a second conducting layer 102 on a pickup surface of the transferring head body 101, where the second conducting layer 102 is configured to electrically connect with a second electrode 613. In a case that the photosensitive conductive bonding layer 53 connects the Micro LED structure with the first conducting layer 4, an electrical signal is applied to the first conducting layer 4 and the second conducting layer 102 to conduct the Micro LED structure.

That is, in the embodiment, during the transferring process, the second conducting layer is provided on the transferring head body to assist electric conduction. In this way, the first electrode and the second electrode of the Micro LED structure are conducted during the transferring process, to control the Micro LED structure to emit light.

It is to be noted that, in order to ensure the light emitted by the Micro LED structure to be absorbed by the photosensitive conductive bonding layer to improve a solidification rate of the photosensitive conductive bonding layer, to increase transferring efficiency, in this embodiment, the second conducting layer may be a metallic reflecting layer, such that the light emitted by the Micro LED is reflected to the photosensitive conductive bonding layer for solidification.

In a case that the Micro LED structure has an ipsilateral-electrode structure, the first conducting layer includes a first sub conducting layer and a second sub conducting layer insulated from each other. The photosensitive conductive bonding layer includes a first photosensitive conductive bonding layer and a second photosensitive conductive bonding layer. The first photosensitive conductive bonding layer is configured to bond the first sub conducting layer to the first electrode. The second photosensitive conductive bonding layer is configured to bond the second sub conducting layer to the second electrode.

Similarly, in order to ensure the light emitted by the Micro LED structure to be absorbed by the photosensitive conductive bonding layer to improve a solidification rate of the photosensitive conductive bonding layer, to increase transferring efficiency, in this embodiment, the transferring head is capable of reflecting light. In one embodiment, the providing a transferring head includes: providing a transferring head body; and forming a reflecting layer on a pickup surface of the transferring head body. That is, a reflecting layer for reflecting light is provided on the transferring head.

In step S103, each of the picked multiple Micro LED structures is bonded to the first conducting layer through the photosensitive conductive bonding layer.

A method of forming the photosensitive conductive bonding layer is not limited in this embodiment. The photosensitive conductive bonding layer may be formed on a to-be-bonded surface of the Micro LED structure, and is directly bonded to the first conducting layer after pickup. In one embodiment, the photosensitive conductive bonding layer may be formed only on a surface of the first conducting layer, and is bonded to the first electrode of the Micro LED structure. In one embodiment, the photosensitive conductive bonding layer may be formed on both the to-be-bonded surface of the Micro LED structure and the surface of the first conducting layer, then the two photosensitive conductive bonding layers are bonded to each other.

Since it is easier to achieve bonding between the same material, as shown in FIG. 12, a photosensitive conductive bonding layer 53 is formed on a surface of a first conducting layer 4, and a photosensitive conductive bonding layer 54 is formed on a to-be-bonded surface of a Micro LED structure, and the Micro LED structure and the first conducting layer 4 are bonded to each other through the photosensitive conductive bonding layer 52 and photosensitive conductive bonding layer 53.

In step S104, an electrical signal is applied to the first conducting layer to conduct the Micro LED structure.

Figure 14:
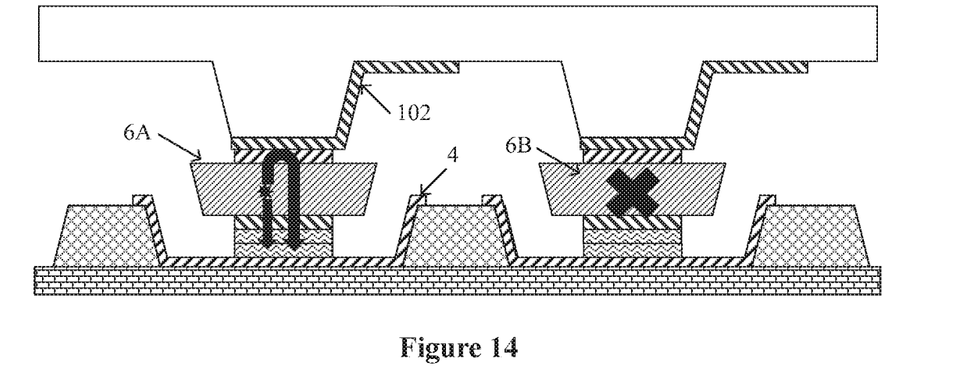
FIG. 14 is a schematic diagram showing a case that a Micro LED emit light in response to an electric signal.

As shown in FIG. 14, the first conducting layer 4 and the second conducting layer 102 are applied with electric signals simultaneously, to apply a voltage to the first electrode and the second electrode of the Micro LED structure. It is assumed that, as shown in FIG. 14, a Micro LED structure 6A on the left emits light normally, and a Micro LED structure 6B on the right emits light abnormally.

Figure 15:
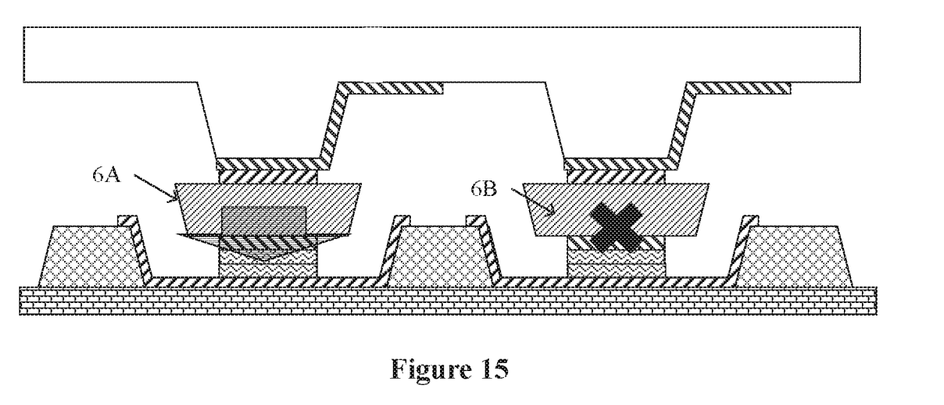
FIG. 15 is a schematic diagram showing a solidification result.

As shown in FIG. 15, FIG. 15 is a schematic diagram showing a solidification result. A photosensitive conductive bonding layer corresponding to the Micro LED structure 6A on the left is solidified after receiving the light emitted by the Micro LED structure 6A. Since the Micro LED structure 6B on the right emit light abnormally, a photosensitive conductive bonding layer corresponding to the Micro LED structure 6B is not solidified.

In step S105, the transferring head is removed.

Figure 16:
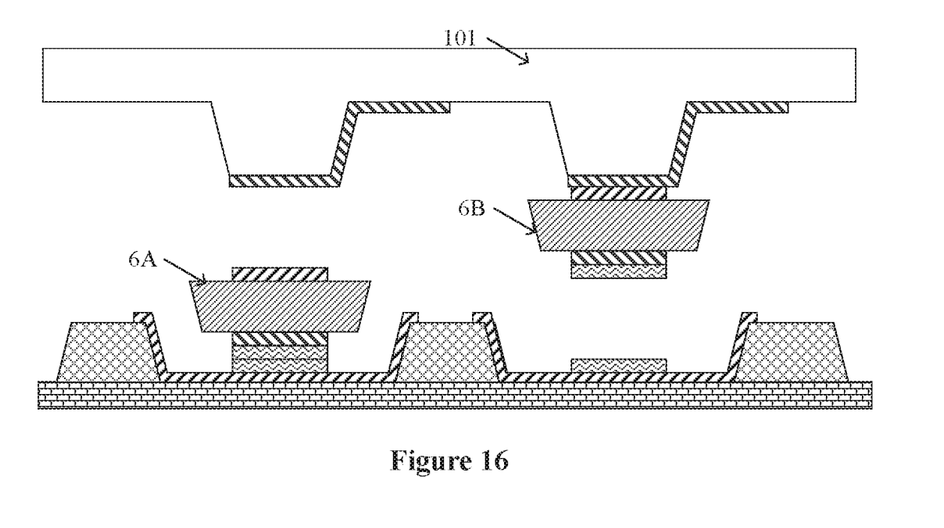
FIG. 16 is a schematic diagram showing a result obtained by removing a transferring head.

In a case of removing the transferring head 101, a Micro LED structure is bonded to the array substrate by the photosensitive conductive bonding layer in a case that the Micro LED structure emits light normally. A Micro LED structure is removed away by the transferring head in a case that the Micro LED structure emits light abnormally.

As shown in FIG. 16, FIG. 16 is a schematic diagram showing a result obtained by removing a transferring head. The Micro LED structure 6A emitting light normally is bonded to the array substrate through the photosensitive conductive bonding layer to realize binding. The Micro LED structure 6B emitting light abnormally is removed by the transferring head 101 due to that the corresponding photosensitive conductive bonding layer is not solidified.

It may be required to perform another transferring process for an un-bonded location caused by the abnormal Micro LED.

In the Micro LED transferring method according to the embodiment of the present disclosure, a photosensitive conductive bonding layer is added. The photosensitive conductive bonding layer is directly solidified in a case that a Micro LED emits light normally, and the bonding is completed. In a case that a Micro LED is abnormal and emits light abnormally, the Micro LED is not transferred. Therefore, the Micro LED is detected during the transferring process, thereby reducing the step of removing a bonded abnormal Micro LED during a subsequent repairing process, thus simplifying the detecting and repairing processes.

The above embodiments in the specification are described in a progressive manner. Each of the embodiments is mainly focused on describing its differences from other embodiments, and references may be made among these embodiments with respect to the same or similar portions among these embodiments. Descriptions of the apparatus disclosed in the embodiments are simple since the apparatus corresponds to the method disclosed in the embodiments, and related explanations can be found in the description of the method.

It should be illustrated that, a relationship term such as "the first" and "the second" herein is only used to distinguish one entity or operation from another entity or operation, and does not necessarily require or imply that there is an actual relationship or sequence between these entities or operations. Furthermore, terms "include", "comprise" or any other variations are intended to cover non-exclusive "include", so that a process, a method, an object or a device including a series of factors not only include the factors, but also include other factors not explicitly listed, or also include inherent factors of the process, the method, the object or the device. Without more limitation, a factor defined in a sentence "include one . . . " does not exclude a case that there is also another same factor in the process, the method, the object or the device including the described factor.

The invention claimed is:

1. A micro light emitting diode (Micro LED) display panel, comprising:
   a substrate;
   a pixel defining layer located on a surface of the substrate, wherein the pixel defining layer comprises a plurality of openings;
   a first conducting layer located in each of the plurality of openings;
   a photosensitive conductive bonding layer located on a surface of the first conducting layer facing away from the substrate; and
   a Micro LED structure located on a surface of the photosensitive conductive bonding layer facing away from the first conducting layer, wherein at least one electrode of the Micro LED structure is electrically connected with the photosensitive conductive bonding layer, and the Micro LED structure has a vertical structure or an ipsilateral-electrode structure and comprises a first semiconductor layer, an active layer and a second semiconductor layer sequentially stacked, and the Micro LED structure further comprises a first electrode and a second electrode, and wherein
   in a case that the Micro LED structure has the vertical structure, the first electrode is located on a surface of the first semiconductor layer facing away from the active layer, and the second electrode is located on a surface of the second semiconductor layer facing away from the active layer, and
   in a case that the Micro LED structure has the ipsilateral-electrode structure, the first electrode is located on a surface of the first semiconductor layer facing away from the active layer, and the second electrode is located on a surface of the second semiconductor layer facing toward the active layer.

2. The Micro LED display panel according to claim 1, wherein the photosensitive conductive bonding layer comprises a photosensitive layer, and the photosensitive layer is doped with metallic balls or nano-silver material.

3. The Micro LED display panel according to claim 2, wherein a material of the photosensitive layer comprises acrylate pre-polymer, active monomers and photo-initiator, and the photo-initiator is visible light photo-initiator.

4. The Micro LED display panel according to claim 3, wherein a dominant absorption wavelength of the photo-initiator is the same as a wavelength of light emitted by the Micro LED structure connected with the photosensitive conductive bonding layer.

5. The Micro LED display panel according to claim 1, wherein in the case that the Micro LED structure has the vertical structure, the first electrode is electrically connected with the first conducting layer through the photosensitive conductive bonding layer.

6. The Micro LED display panel according to claim 5, further comprising a second conducting layer, wherein the second conducting layer is electrically connected with the second electrode, and the Micro LED structure is controlled to emit light in response to an electrical signal applied to the first conducting layer and the second conducting layer.

7. The Micro LED display panel according to claim 6, wherein
   the Micro LED display panel is a passive matrix light emitting diode display panel; or
   the Micro LED display panel is an active matrix light emitting diode display panel, wherein
   in a case where the Micro LED display panel is an active matrix light emitting diode display panel, the substrate is provided with a plurality of thin film transistors, at least two of the plurality of thin film transistors are configured to control one Micro LED structure, wherein one of the at least two thin film transistors is configured as a driving transistor, and at least one of the at least two thin film transistors other than the thin film transistor configured as the driving transistor is configured to supply a control voltage to the driving transistor, and wherein
   the driving transistor comprises a gate, a source and a drain;
   the drain is electrically connected with the first conducting layer; and
   the second conducting layers in the plurality of openings are electrically connected to each other.

8. The Micro LED display panel according to claim 1, wherein in the case that the Micro LED structure has the ipsilateral-electrode structure,
   the first conducting layer comprises a first sub conducting layer and a second sub conducting layer insulated from each other; and
   the photosensitive conductive bonding layer comprises a first photosensitive conductive bonding layer and a second photosensitive conductive bonding layer, and wherein
   the first photosensitive conductive bonding layer is located on a surface of the first sub conducting layer facing away from the substrate;
   the second photosensitive conductive bonding layer is located on a surface of the second sub conducting layer facing away from the substrate;
   the first electrode is electrically connected with the first sub conducting layer through the first photosensitive conductive bonding layer;
   the second electrode is electrically connected with the second sub conducting layer through the second photosensitive conductive bonding layer; and the Micro LED structure is controlled to emit light in response to an electrical signal applied to the first sub conducting layer and the second sub conducting layer.

9. The Micro LED display panel according to claim 8, wherein the Micro LED display panel is a passive matrix light emitting diode display panel.

10. The Micro LED display panel according to claim 8, wherein
the Micro LED display panel is an active matrix light emitting diode display panel,
the substrate further comprises a plurality of thin film transistors, at least two of the plurality of thin film transistors control one Micro LED structure, wherein one of the at least two thin film transistors is configured as a driving transistor, and at least one of the at least two thin film transistors other than the thin film transistor configured as the driving transistor is configured to supply a control voltage to the driving transistor, and wherein
the driving transistor comprises a gate, a source and a drain;
the drain is electrically connected with the first sub conducting layer; and
the second sub conducting layers in the plurality of openings are electrically connected to each other.

11. A Micro LED display device, comprising:
a Micro LED display panel, wherein the Micro LED display panel comprises:
a substrate;
a pixel defining layer located on a surface of the substrate, wherein the pixel defining layer comprises a plurality of openings;
first conducting layers respectively located in the plurality of openings;
a photosensitive conductive bonding layer located on a surface of each of the first conducting layers facing away from the substrate; and
a Micro LED structure located on a surface of the photosensitive conductive bonding layer facing away from the first conducting layer, wherein at least one electrode of the Micro LED structure is electrically connected with the photosensitive conductive bonding layer, and the Micro LED structure has a vertical structure or an ipsilateral-electrode structure and comprises a first semiconductor layer, an active layer and a second semiconductor layer sequentially stacked, and the Micro LED structure further comprises a first electrode and a second electrode, and wherein
in a case that the Micro LED structure has the vertical structure, the first electrode is located on a surface of the first semiconductor layer facing away from the active layer, and the second electrode is located on a surface of the second semiconductor layer facing away from the active layer, and
in a case that the Micro LED structure has the ipsilateral-electrode structure, the first electrode is located on a surface of the first semiconductor layer facing away from the active layer, and the second electrode is located on a surface of the second semiconductor layer facing toward the active layer.

12. A Micro LED transferring method for forming a Micro LED display panel, wherein the Micro LED transferring method comprises:
providing an array substrate, a plurality of Micro LED structures, photosensitive conductive bonding layers and a transferring head, wherein the array substrate comprises a substrate, a pixel defining layer located on the substrate and first conducting layers, the pixel defining layer comprises a plurality of openings, the first conducting layers are respectively located in the plurality of openings;
picking up, by the transferring head, the plurality of Micro LED structures;
bonding each of the picked plurality of Micro LED structures to one first conducting layer via the photosensitive conductive bonding layer;
conducting the Micro LED structure in response to an electrical signal applied to the first conducting layer; and
removing the transferring head, wherein
in a case that the Micro LED structure emits light normally, the Micro LED structure is bonded to the array substrate through the photosensitive conductive layer; and
in a case that the Micro LED structure emits light abnormally, the Micro LED structure is removed away by the transferring head.

13. The Micro LED transferring method according to claim 12, wherein
the Micro LED structure has a vertical structure and comprises a first electrode and a second electrode located opposite to each other, the first conducting layer and the photosensitive conductive bonding layer are configured as entire layers, and the photosensitive conductive bonding layer is configured to connect with the first electrode, and
the providing a transferring head comprises:
providing a transferring head body; and
forming a second conducting layer on a pickup surface of the transferring head body, wherein the second conducting layer is configured to electrically connect with the second electrode, and wherein
in a case that the photosensitive conductive bonding layer connects the Micro LED structure with the first conducting layer, an electrical signal is applied to the first conducting layer and the second conducting layer to conduct the Micro LED structure.

14. The Micro LED transferring method according to claim 13, wherein the second conducting layer is a metallic reflecting layer.

15. The Micro LED transferring method according to claim 12, wherein
the Micro LED structure has an ipsilateral-electrode structure,
the first conducting layer comprises a first sub conducting layer and a second sub conducting layer insulated from each other, and
the photosensitive conductive bonding layer comprises a first photosensitive conductive bonding layer and a second photosensitive conductive bonding layer.

16. The Micro LED transferring method according to claim 15, wherein the transferring head is capable of reflecting light.

17. The Micro LED transferring method according to claim 15, wherein the providing a transferring head comprises:
providing a transferring head body; and
forming a reflecting layer on a pickup surface of the transferring head body.

18. The Micro LED transferring method according to claim 12, wherein the bonding each of the picked plurality of Micro LED structures to one first conducting layer via the photosensitive conductive bonding layer comprises at least one of the following steps:
    forming the photosensitive conductive bonding layer on a to-be-bonded surface of the Micro LED structure; and
    forming the photosensitive conductive bonding layer on a surface of the first conducting layer.

\* \* \* \* \*

UNITED STATES PATENT AND TRADEMARK OFFICE
CERTIFICATE OF CORRECTION

PATENT NO. : 10,741,739 B2  
APPLICATION NO. : 16/244102  
DATED : August 11, 2020  
INVENTOR(S) : Zeshang He et al.

Page 1 of 1

It is certified that error appears in the above-identified patent and that said Letters Patent is hereby corrected as shown below:

On the Title Page

In the Assignee item (73), please add assignee's name:  
--SHANGHAI TIANMA MICRO-ELECTRONICS CO., LTD., Shanghai, (CN)--

Signed and Sealed this  
Twenty-fifth Day of May, 2021

Drew Hirshfeld  
*Performing the Functions and Duties of the*  
*Under Secretary of Commerce for Intellectual Property and*  
*Director of the United States Patent and Trademark Office*